(12) United States Patent
Borkar et al.

(10) Patent No.: US 8,218,676 B2
(45) Date of Patent: Jul. 10, 2012

(54) SYSTEM AND METHOD FOR TRAINING PRE-INVERSE OF NONLINEAR SYSTEM

(75) Inventors: Milind Anil Borkar, Dallas, TX (US); Fernando Alberto Mujica, Allen, TX (US); Seydou Nourou Ba, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 728 days.

(21) Appl. No.: 12/342,269

(22) Filed: Dec. 23, 2008

(65) Prior Publication Data
US 2010/0158155 A1 Jun. 24, 2010

(51) Int. Cl.
*H04K 1/02* (2006.01)
(52) U.S. Cl. ....... 375/296; 375/297; 330/149; 455/63.1; 455/114.3
(58) Field of Classification Search .......... 375/296–297; 330/149; 455/63.1, 114.3
See application file for complete search history.

(56) References Cited

U.S. PATENT DOCUMENTS

| | | | | |
|---|---|---|---|---|
| 7,170,345 B2 * | 1/2007 | Hongo | | 330/149 |
| 7,663,436 B2 * | 2/2010 | Takano et al. | | 330/149 |
| 7,733,177 B1 * | 6/2010 | Borkar et al. | | 330/149 |
| 2005/0190857 A1 * | 9/2005 | Braithwaite | | 375/296 |

OTHER PUBLICATIONS

Taylor "Interpolation and Deformations", Oct. 10, 2002.*

* cited by examiner

*Primary Examiner* — Sam K Ahn
*Assistant Examiner* — Sophia Vlahos
(74) *Attorney, Agent, or Firm* — Alan A. R. Cooper; Wade James Brady, III; Frederick J. Telecky, Jr.

(57) ABSTRACT

A circuit for use with an amplification circuit having a predistortion datapath portion, a power amplifier portion and a gain portion. The predistortion datapath portion can output a predistorted signal based on the input signal. The power amplifier portion can output an amplified signal based on the predistorted signal. The gain portion can output a gain output signal based on the amplified signal. The circuit comprises a digital predistortion adaptation portion and a combiner. The digital predistortion adaptation portion can output a predistortion adaptation portion output signal. The combiner can output an error signal. The predistortion adaptation portion output signal is based on the input signal, the gain output signal and the error signal. The error signal is based on the difference between the predistorted signal and the predistortion adaptation portion output signal.

24 Claims, 9 Drawing Sheets

SYSTEM AND METHOD FOR TRAINING PRE-INVERSE OF NONLINEAR SYSTEM

BACKGROUND

Power amplifiers (PA) are essential components in wireless applications that boost the power of the analog signal being transmitted. However, these are power hungry devices and must be operated close to saturation to maximize their efficiency. This causes problems as PAs are inherently nonlinear near saturation, leading to unacceptable error vector magnitude (EVM) and adjacent channel leakage ratio (ACLR) performance. Digital predistortion (DPD) is a popular technique to linearize the input-output characteristics of PAs.

FIG. 1 illustrates a conventional DPD datapath portion of a circuit. In the figure, DPD datapath portion 100 includes three primary blocks: an address calculator portion 102, a lookup table (LUT) portion 104, and an interpolation unit (optional) 106. DPD datapath portion 100 also includes a multiplier 108.

In operation, address calculator portion 102 receives an input signal 110 and determines the appropriate indices m and n of the LUT portion 104. The basic operation of address calculator portion 102 will now be described with reference to FIG. 2.

FIG. 2 illustrates a data set 200 of address calculator portion 102. Address calculator portion 102 may be a register having number of addresses that may vary depending on the needs of the system. For example, suppose that a system is designed to receive a signal having an amplitude that varies between −3.0 mA and +3.0 mA. In such a system, if address calculator portion 102 included a 4-bit register, then data set 200 would include 16 data entries between −3.0 mA and +3.0 mA, wherein the data entries have a 0.375 mA resolution. On the other hand, if address calculator portion 102 included an 8-bit register, then data set 200 would include 256 data entries between −3.0 mA and +3.0 mA, wherein the data entries have a 0.023 mA resolution. Clearly, a register having a smaller number of bits may occupy a relatively small amount of physical space, but will be able to address a relatively small number of data entries. On the other hand, larger register may occupy a relatively large amount of physical space, but will be able to address a relatively large number of data entries. Of course address calculator portion may have any known system of data entries, a non-limiting example of which includes non-uniform data entries.

Data set 200 in FIG. 2 includes a set of entries from 1 to a predetermined number Φ.

Presume at a time t, input signal 110 inputs a value x to address calculator portion 102. Further, presume that the value x is not stored within any of the entries from 1 to Φ, but lies between the values m and n stored in entries 202 and 203 of data set 200. Address calculator portion 102 outputs the values m and n stored in entries 202 and 203 as signals 112 and 114. If, for the sake of discussion, the value x exactly matches an entry within data set 200, then address calculator portion 102 may output the matching entry as signal 112, and may output a zero value for signal 114. In any event, it is statistically likely that the input value will not be identical to an entry within data entry set 200.

Once, address calculator portion 102 provides values m and n corresponding to an input value, LUT portion 104 will generate corresponding gain values. Operation of an example LUT portion 104 will be discussed with reference to FIG. 3.

FIG. 3 illustrates a data structure that may be stored within LUT portion 104. LUT portion 104 may include a plurality of registers that make up lookup tables 300 and 310. Lookup table 300 corresponds to entries of input m, whereas lookup table 310 corresponds to entries of input n. In other examples, LUT portion 104 may be structured in any known manner, a non-limiting example of which includes a single lookup table having entries for input m and input n.

Lookup table 300 includes a first column of data entries 302 that correspond to input m values from address calculator portion 102, and a second column of corresponding data entries 304 of gain values $G_m$. For each data entry of first column of data entries 302 there is a corresponding output gain entry value in second column of corresponding data entries 304 of gain values $G_m$. For example, with additional reference to FIG. 1, for a value m passed via signal 112 from address calculator portion 102, there is a corresponding data entry 306 in first column of data entries 302. Accordingly, the gain $G_m$ that corresponds to m value data entry 306 is data entry 308 in second column of corresponding data entries 304 of gain values $G_m$.

Similarly, lookup table 310 includes a first column of data entries 312 that correspond to input n values from address calculator portion 102, and a second column of corresponding data entries 314 of gain values $G_n$. For each data entry of first column of data entries 312 there is a corresponding output gain entry value in second column of corresponding data entries 314 of gain values $G_n$. For example, with additional reference to FIG. 1, for a value n passed via signal 114 from address calculator portion 102, there is a corresponding data entry 316 in first column of data entries 312. Accordingly, the gain $G_n$ that corresponds to n value data entry 316 is data entry 318 in second column of corresponding data entries 314 of gain values $G_n$.

Returning to FIG. 1, LUT portion 104 outputs a first gain value $G_1$, corresponding to data entry 308 of FIG. 3, via signal 116, and outputs a second gain value $G_2$, corresponding to data entry 318 of FIG. 3, via signal 118 to interpolation unit 106.

Interpolation unit 106 may not be needed all the time. As described above, if a value x of input 110 at time t exactly matches an entry within data set 200, as illustrated in FIG. 2, then no interpolation is needed. Specifically, in such a case, a predetermined gain value will be provided by LUT portion 104 and a specific gain will be output via signal 120 from interpolation unit 106. However, if a value x of input 110 at time t is between data entry 202 and 203, as illustrated in FIG. 2, then LUT portion 104 outputs gain values $G_1$ and $G_2$ via signal 116 and 118. Interpolation unit 106 determines an exact gain that lies between gain values $G_1$ and $G_2$. Operation of an example interpolation unit 106 will be now be discussed with reference to FIG. 4.

FIG. 4 is a graph of a gain function of a conventional interpolation unit 106, wherein a value x of input 110 at time t is on the x-axis, and a corresponding output gain value G(x) is on the y-axis. The graph explains how conventional interpolation unit 106 may interpolate a gain for an input value located between two predetermined input values. In FIG. 4, point 402 corresponds to gain $G_n$ for input n, whereas point 404 corresponds to gain $G_m$ for input m. Interpolation unit 106 generates an interpolate function $f(\lambda)$ 406 based on an interpolation factor $\lambda$ 124 provided by address calculator portion 102. For an input value x at time t from input signal 110, wherein x is between m and n as discussed above, conventional interpolation unit 106 interpolates a corresponding gain $G_x$ at point 412 based on the interpolation function $f(\lambda)$. This gain, $G_x$, is the final gain G that interpolation unit 106 outputs to multiplier 108 via interpolator output signal 120, when the value of x does not match the value of either one of m or n.

However, with a conventional interpolation scheme, interpolation unit 106 may use any one of a plurality of interpolate functions, e.g., interpolation functions 408 and 410, to determine an output gain for an input x at time t. As illustrated in the figure, if a different interpolation function is used, then a different corresponding gain will be calculated. For example, if interpolation function 408 were used to determine an output gain for input value x at time t, as opposed to interpolation function $f(\lambda)$ 406, then the point 414 on interpolation function 408 would provide an output gain of $G_x'$, which in this case is larger than $G_x$. This inconsistency in gains as a result of having a plurality of possible interpolation functions is a drawback of conventional interpolation techniques and will be discussed further below.

Returning back to FIG. 1, multiplier 108 multiplies the final gain G, included in interpolator output signal 120, with input signal 110 and outputs a predistorted signal 126 to a PA (not shown).

The goal of predistortion is to provide a linear response through a cascade of the DPD and the PA. However, due to numerous reasons such as manufacturing variations, age, and temperature, the PA's nonlinear characteristics can vary over time and also from PA to PA. Hence online adaptation of the DPD to compensate for the prevalent PA nonlinearity is essential. Two popular conventional learning architectures that compensate for the prevalent PA nonlinearity include a Direct Learning Architecture (DLA) and an Indirect Learning Architecture (ILA). These two conventional learning architectures will be discussed below.

FIG. 5 illustrates a block diagram of a conventional direct learning architecture (DLA). Circuit 500 includes a DPD datapath portion 502, a PA 504, a gain inverter 506 and a comparator 508. DPD datapath portion 502 corresponds to DPD datapath portion 100 in FIG. 1.

In operation, an input signal x[n] 510 is fed into DPD datapath portion 502. DPD datapath portion 502 then outputs a predistorted input signal 512 to PA 504. Since PA 504 itself does not have a good linearity characteristic for high amplitude inputs, the output amplified signal y[n] 514 may not be linear. Therefore, a conventional DLA trains the pre-inverse of the nonlinearity of PA 504 over the entire swing of input signal x[n] 510. Output amplified signal y[n] 514 is multiplied with the reciprocal of amplifier gain G by gain inverter 506, to become a feedback signal 516. Feedback signal 516 is sent to comparator 508 for comparison with input signal x[n] 510. Based on the comparison, comparator 508 outputs an error signal e[n] 518 to DPD datapath portion 502. DPD datapath portion 502 adjusts predistorted input signal 512 based on the error signal e[n] 518.

However, the conventional DLA has various implementation issues since the adaptation takes place in the forward path. Referring to FIG. 5, gain inverter 506 directly samples PA's output 514 and feeds back the inverse of signal 514 to comparator 508. Such training that occurs in the transmission path will be problematic. To overcome this drawback, the conventional DLA could use a model in which training occurs outside the forward path and the trained DPD parameters can be copied over to the forward path at predetermined intervals. A modified DLA model is shown in FIG. 6 below.

FIG. 6 illustrates a conventional modified DLA. Circuit 600 includes DPD datapath portion 502 and PA 504. In addition, circuit 600 includes a DPD adaptation portion 602, a PA model portion 604, an inverter 606 and a comparator 608.

In operation, DPD datapath portion 502 receives input signal x[n] 510 and outputs predistorted input signal 512 to PA 504. A difference between the conventional modified DLA of FIG. 6 and the conventional DLA of FIG. 5 is that in modified DLA, the training occurs outside the forward path.

Referring to FIG. 6, input signal x[n] 510 is also sent to DPD adaptation portion 602, which outputs a predistorted input signal 610 to PA model portion 604. Note that it is PA model portion 604 that provides feedback, i.e., signal ŷ[n] 612, to inverter 606 in modified DLA 600, as opposed to PA 504 as described above with reference to FIG. 5. Inverter 606 multiples signal ŷ[n] 612 with reciprocal of amplifier gain G and provides the result, a feedback signal 614, to comparator 608. Comparator 608 compares input signal x[n] 510 with feedback signal 614, and generates an error signal e[n] 616.

Error signal e[n] 616 is fed into DPD adaptation portion 602 to determine the adjustment to the DPD datapath portion 502 to modify predistorted input signal 512 in order to linearize the gain of PA 504. More specifically, as will be described in more detail below, a trainable LUT portion (not shown) within DPD adaptation portion 602 may update an LUT portion (not shown) within DPD datapath portion 502 through a signal 618 periodically, based on a predetermined time interval. As a consequence, predistorted input signal 512 will be updated periodically in order keep an output signal y[n] 514, from PA 504, linear. The mathematical analysis of this modified model is shown below, with reference to FIGS. 1 and 6.

If H(x) is the gain provided by LUT portion 104 for an input x, F(•) is a nonlinear gain of PA 504, and G is the desired linear gain of PA 504, then DLA 600 adapts such that $$H(x)F(xH(x))=G \tag{1}$$

Equation (1) mathematically explains how the desired linear gain G of PA 504 is constructed. If PA 504 is nonlinear, its output gain F(xH(x)) is also not linear. Therefore, the gain H(x) provided by LUT 104 will compensate the nonlinear gain of PA 504 to a desired linear gain G.

Using a more general system representation with F(•) representing the operator of PA 504 and H(•) representing the operator of DPD datapath portion 502, equation (1) can be written as $$F(H(x))=G \cdot x \tag{2}$$

Equation (2) shows that DPD adaptation portion 602 provides predistorted input to PA 504 so that PA can generate a desired linear output, which is G·x.

The drawback of the modified DLA is that an accurate PA model must always be maintained, requiring additional memory and training, which further increases the cost of the system.

Indirect learning architecture (ILA) is another conventional training architecture that avoids the drawback of DLA. A conventional ILA will now be described with reference to FIGS. 7 and 8.

FIG. 7 illustrates a block diagram for a conventional ILA. In the figure, circuit 700 includes a DPD datapath portion 702, a PA 704, a gain inverter 706, a comparator 708 and a DPD adaptation portion 710.

In operation, DPD datapath portion 702 receives an input signal x[n] 712 and outputs a predistorted input signal w[n] 714 to PA 704. PA 704 provides an output amplified signal y[n] 716 to gain inverter 706. Gain inverter multiplies output amplified signal y[n] 716 with the reciprocal of amplifier gain G, to become a feedback signal z[n] 718, which is provided to DPD adaptation portion 710.

Contrary to the DLA described above with respect to FIGS. 5 and 6, in the ILA, DPD Datapath portion 702 is trained outside the forward path without the need for a PA model.

In FIG. 7, predistorted input signal w[n] 714 is additionally sent to comparator 708. DPD adaptation portion 710 outputs a signal ŵ[n] 724, based on feedback signal z[n] 718, to comparator 708. Comparator 708 compares predistorted input signal w[n] 714 with signal ŵ[n] 724 and generates an error signal e[n] 720.

Error signal e[n] 720 is then fed back to DPD adaptation portion 710, which will update the adjustment to predistorted input signal w[n] 714 in order to linearize the gain of PA 704. More specifically, a trainable LUT portion (not shown) within DPD adaptation portion 710 may update an LUT portion (not shown) within DPD datapath portion 702 through a signal 722 periodically, based on a predetermined time interval. As a consequence, predistorted input signal w[n] 714 will be updated periodically in order keep an output signal 714, from PA 704, linear.

In FIG. 7, although DPD adaptation portion 710 is the pre-inverse of PA 704, circuit 700 trains DPD adaptation portion 710 as the post-inverse of PA 704. Assuming that predistorted input signal w[n] 714 and signal ŵ[n] 724 are identical, the trained parameters of DPD adaptation portion 710 are copied over to DPD datapath portion 702 at predetermined intervals. The mathematical analysis of this modified model is shown below, with reference to FIGS. 1 and 7.

If H(x) is the gain provided by LUT 104 for an input x, F(•) is the nonlinear gain of PA 704, H̃(•) is the gain provided by LUT 104 being trained, and G is the desired linear gain of PA 704, then the ILA 700 adapts such that $$F(xH(x)) \cdot \tilde{H}\left(\frac{xH(x) \cdot F(xH(x))}{G}\right) = G \quad (3)$$

In equation (3), xH(x) is the input of PA 704 and F(xH(x)) is the output gain of PA 704. F(xH(x)) is not linear due to the nonlinearity of PA 704.

$$\tilde{H}\left(\frac{xH(x) \cdot F(xH(x))}{G}\right),$$

which is the gain provided by trained LUT 104 of DPD adaptation portion 710, is used to compensate for the nonlinearity of the output gain F(xH(x)) of PA 704 and results in a desired linear gain G.

Using a more general system representation with F(•) representing the operator of PA 704, H(•) representing the operator of DPD datapath portion 702 and H̃(•) representing the operator of DPD adaptation portion 710, equation (3) can be written as $$\tilde{H}\left(\frac{F(H(x))}{G}\right) = H(x) \quad (4)$$

In equation (4), $$\tilde{H}\left(\frac{F(H(x))}{G}\right)$$

represents the output of DPD adaptation portion 710, H(x) represents the output of DPD datapath portion 702. Equation (4) implies that outputs of DPD adaptation portion 710 and DPD datapath portion 702 are equal when the system is stable.

The primary drawback of ILA is that the DPD parameters are trained over the PA output values. Due to the gain compression characteristics of the PA, the output signal swing could be smaller than that of the input signal. Hence some entries in the LUT, particularly the higher amplitude entries, might never be trained. Such behavior is seen in FIGS. 8A-8C.

FIG. 8A is a graph of a gain transfer characteristics of DPD datapath portion 702, wherein the x-axis represents the input to DPD datapath portion 702 and the y-axis represents the output from DPD datapath portion 702. In FIG. 8A, a gain transfer characteristics 802 is curved having a first portion 804 over the majority of the input portion of the graph that is curved slightly upward in a convex fashion and having a second portion 806 at the upper input portion of the graph that is linear after a discontinuity. As discussed above, second portion 806 is distortion caused by the drawback of ILA in which the LUT is difficult to train for higher amplitude entries.

FIG. 8B is a graph of a gain transfer characteristics of PA 704, wherein the x-axis represents the input to PA 704 and the y-axis represents the output from PA 704. In FIG. 8B, a gain transfer characteristics 808 is a curve that is curved slightly downward in a concave fashion. The non-linearity of gain transfer characteristics 808 illustrates the non-linearity of the power amplifier 704.

FIG. 8C is a graph of a gain transfer characteristics of DPD datapath portion 702 and PA 704, wherein the x-axis represents the input to DPD datapath portion 702 and the y-axis represents the output from PA 704. In FIG. 8C, a gain transfer characteristics 810 is curve having a first portion 812 over the majority of the input portion of the graph that is linear and having a second portion 814 at the upper input portion of the graph that is curved downward in a concave fashion after a discontinuity. FIG. 8C illustrates that DPD datapath portion 702 may not be trained over entire input signal swing in ILA.

Both DLA and ILA discussed above use a standard least mean squares (LMS) algorithm when interpolating between two indices in a LUT in order to provide a linearized gain to a PA. However, the traditional LMS algorithm has some significant limitations on efficiency and accuracy, as explained below.

FIG. 9 illustrates an exploded view of DPD adaptation portion 710 of FIG. 7, in combination with comparator 708, that is used to train DPD datapath portion 702 by interpolating between two indices in a LUT in order to provide a linearized gain to a PA. DPD adaptation portion 710 includes an address calculator portion 902, a trainable LUT portion 904, an interpolation unit 906 and a multiplier 908.

In ILA operation, address calculator portion 902 receives feedback signal z[n] 718 and determines the appropriate indices m and n of LUT portion 904. Address calculator portion 902 then outputs the indices information to LUT portion 904 through indices signals 916 and 918. LUT portion 904 provides the gains stored at the requested indices m and n. The outputs of LUT portion 904, $G_1$ and $G_2$, which are represented by signals 920 and 922 respectively, are sent to interpolation unit 906. Interpolation unit 906 then interpolates between the multiple gains based on the interpolation factor 924 and provides a signal 926 as a final gain G to multiplier 908. Multiplier 908 multiples the final gain G from signal 926 with feedback signal z[n] 718 and outputs signal ŵ[n] 724 to comparator 708. Comparator 708 compares signal ŵ[n] 724 with predistorted input signal w[n] 714 and generates error signal e[n] 720. Error signal e[n] 720 is used to modify indices within trainable LUT portion 904, i.e., train trainable LUT portion 904. Since signal ŵ[n] 724 continues to update and feed back to comparator 708, eventually error signal e[n] 720 approaches zero.

With additional reference to FIG. 7, periodically, the indices within trainable LUT portion 904 are copied to the LUT (not shown) within DPD datapath portion 702. As error signal e[n] 720 approaches zero, eventually the indices within trainable LUT portion 904 are copied to the LUT within DPD datapath portion 702. Accordingly, predistorted input signal w[n] 914 approaches a desired gain to a PA (not shown).

The standard LMS algorithm used with interpolated LUTs uses standard gradient descent techniques, which require interpolation between LUT entries. An error term is generated by comparing a reference signal with the amplified input and is used to train the LUT. This is mathematically explained below.

$$e = w - Gy$$

$$e = w - [G_m + \lambda(G_n - G_m)]y$$

$$e = w - yG_m + \lambda(w - yG_n - w + yG_m) \quad (5)$$

Let $$e_m = w - G_m y$$

$$e_n = w - G_n y \quad (6)$$

Substituting (6) into (5) yields $$e = e_m + \lambda(e_n - e_m)$$

$$e = (1-\lambda)e_m + \lambda e_n \quad (7)$$

Let a cost function C be defined to be minimized as $$C = e^* e$$

$$C = [(1-\lambda)e_m + \lambda e_n]^* [(1-\lambda)e_m + \lambda e_n]$$

$$C = (1-\lambda)^2 |e_m|^2 + 2Re\{\lambda(1-\lambda)e_m^* e_n\} + \lambda^2 |e_n|^2 \quad (8)$$

Here, e* is the complex conjugate of complex number e. Therefore, C=0 implies e=0, but not $e_m = e_n$. In practice, it is nearly impossible to actually achieve C=0. However, gradient descent algorithms like LMS apply corrections to the adaptive parameters of the system, which in this case is simply the interpolated gain G, along the direction that minimizes the cost function C. For a given combination of {w, y} an infinite number of $\{G_m, G_n\}$ pairs can result in the same interpolated gain G, leading to non unique solutions for $\{G_m, G_n\}$. This is shown FIG. 10.

FIG. 10 is a graph of a plurality of interpolated gain functions, wherein the x-axis is an input y and the y-axis is the associated gain G=w/y. In the figure, infinite $\{G_m, G_n\}$ pairs result in the same interpolated gain G for a given y. Solid line 1002 represents the correct gain to be applied for varying inputs. However, for a particular input y, dashed lines 1004, 1006, 1008, 1010 and 1012 all intersect the same interpolated gain G. FIG. 10 illustrates that the standard LMS algorithm has the drawback of non-unique solutions. Consider the update equations below, $$\begin{bmatrix} G_m \\ G_n \end{bmatrix} = \begin{bmatrix} G_m \\ G_n \end{bmatrix} - \frac{\mu}{2} \nabla e^* e \quad (9)$$

$$\begin{bmatrix} G_m \\ G_n \end{bmatrix} = \begin{bmatrix} G_m \\ G_n \end{bmatrix} + \mu \begin{bmatrix} 1-\lambda \\ \lambda \end{bmatrix} y^* e$$

-continued $$\begin{bmatrix} G_m \\ G_n \end{bmatrix} = \begin{bmatrix} G_m \\ G_n \end{bmatrix} + \mu y^* \begin{bmatrix} (1-\lambda)^2 e_m + \lambda(1-\lambda)e_n \\ \lambda^2 e_n + \lambda(1-\lambda)e_m \end{bmatrix}$$

Here, $\nabla$ is the gradient and $\mu$ is the step of gradient descent. Note that in equation (9), the direction of the correction term applied to both neighboring gain entries in the LUT is the same, regardless of the correctness of the individual entries. Only the scale factors are different.

The standard LMS algorithm used in conventional LUT based DPD datapath portion has the advantages of requiring computation of only a single error term and requiring only a single adaptation algorithm. However, the drawbacks of conventional a LUT implementation are more significant. First, it requires an interpolation block to determine an interpolated gain. Second, for a given combination of {w, y}, an infinite number of $\{G_m, G_n\}$ pairs can result in the same interpolated gain G that minimizes the cost function. Finally, the direction of the correction applied to both $\{G_m, G_n\}$ is the same, regardless of the correctness of each individual term. Such disadvantages limit both accuracy and cost of the system.

What is needed is a training architecture that combines the strengths of DLA and ILA but overcome the drawbacks of two traditional training architectures. The new training architecture should be able to provide improved linearization performance.

BRIEF SUMMARY

It is an object of the present invention to provide a training architecture that combines the strengths of DLA and ILA but overcome the drawbacks of two traditional training architectures.

In accordance with an aspect of the present invention, a circuit may be used with an amplification circuit having a predistortion datapath portion, a power amplifier portion and a gain portion. The predistortion datapath portion can output a predistorted signal based on the input signal. The power amplifier portion can output an amplified signal based on the predistorted signal. The gain portion can output a gain output signal based on the amplified signal. The circuit comprises a digital predistortion adaptation portion and a combiner. The digital predistortion adaptation portion can output a predistortion adaptation portion output signal. The combiner can output an error signal. The predistortion adaptation portion output signal is based on the input signal, the gain output signal and the error signal. The error signal is based on the difference between the predistorted signal and the predistortion adaptation portion output signal.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

An aspect in accordance with the present invention includes a hybrid learning architecture (HLA) that combines the strengths of both DLA and ILA. In particular, the DPD parameters are trained over the input signal values, like in DLA, whereas the training occurs outside the forward path without the need for a PA model, like in ILA. A block diagram for an example HLA circuit in accordance with an aspect of the present invention will now be described with reference to FIG. 11.

As illustrated in the figure, circuit 1100 includes a DPD datapath portion 1102, PA 704, gain inverter 706, a DPD adaptation portion 1104 and comparator 708.

Figure 1:
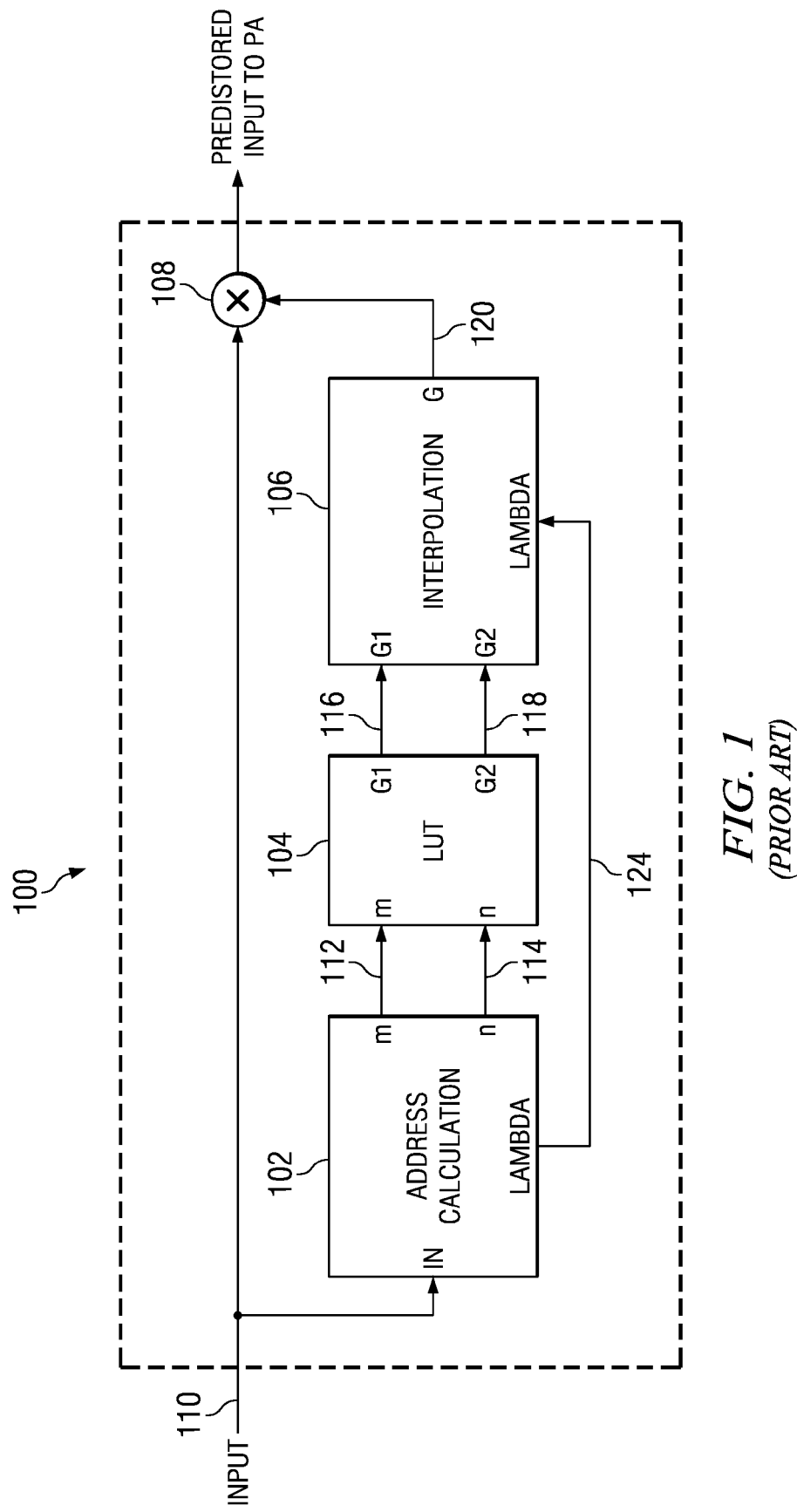
FIG. 1 illustrates a conventional DPD datapath portion of a circuit.
Figure 2:
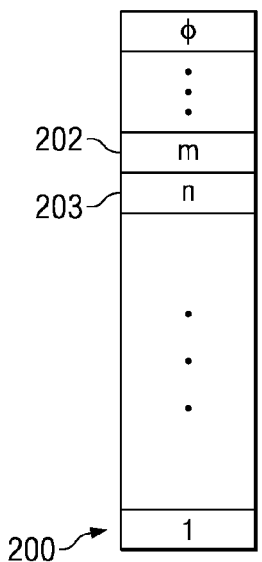
FIG. 2 illustrates a data set of the address calculator portion of FIG. 1.
Figure 3:
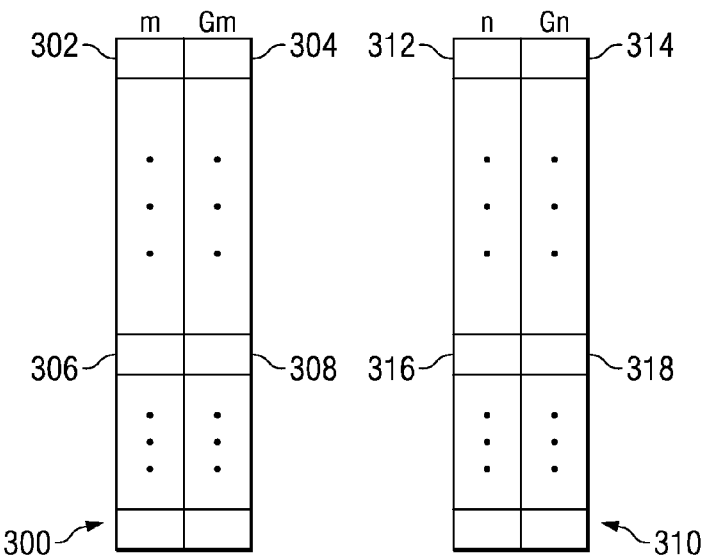
FIG. 3 illustrates a data structure that may be stored within the LUT portion of FIG. 1.
Figure 4:
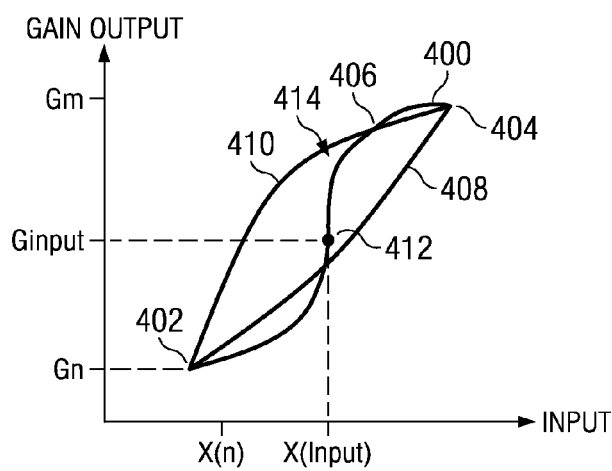
FIG. 4 is a graph of a gain function of a conventional interpolation unit.
Figure 5:
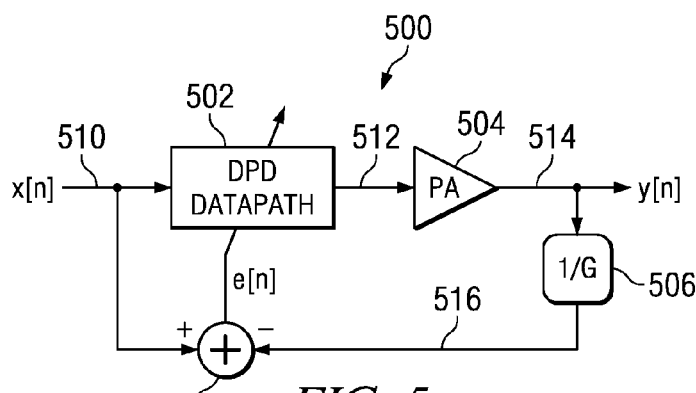
FIG. 5 illustrates a block diagram of a conventional DLA.
Figure 6:
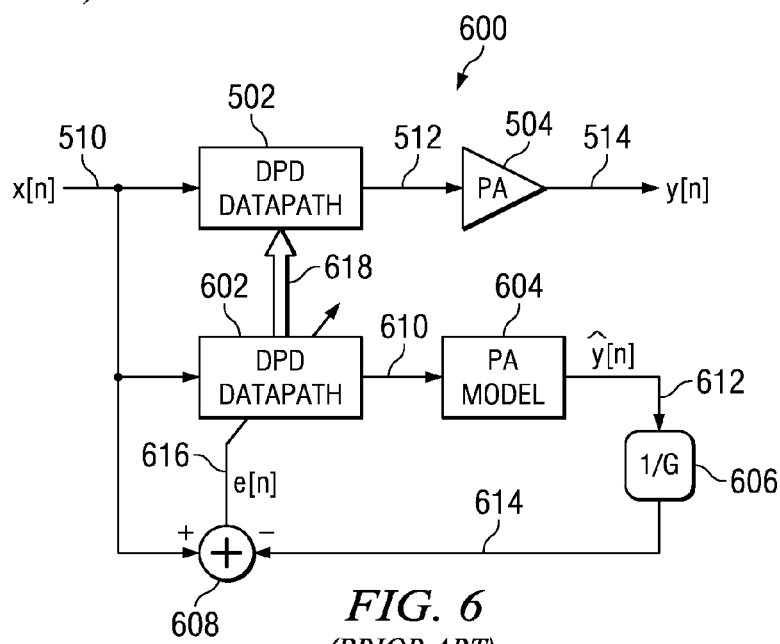
FIG. 6 illustrates a conventional modified DLA.
Figure 7:
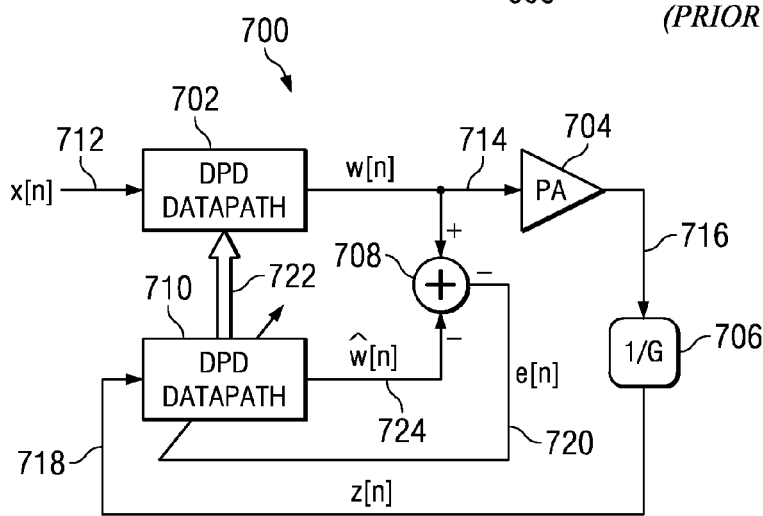
FIG. 7 illustrates a block diagram for a conventional ILA.

Circuit 1100 differs from circuit 700 of FIG. 7, at least in that DPD adaptation portion 1104 receives three inputs. In circuit 1100, DPD adaptation portion 1104 receives an output signal z[n] 1110 from gain inverter 706, an error signal e[n] 1116 from comparator 708 as well as input signal x[n] 712. In circuit 700, DPD adaptation portion 710 receives only feedback signal z[n] 718 from gain inverter 706 as well as error signal e[n] 720. Therefore, in circuit 700, DPD adaptation portion 710 does not receive input signal x[n] 712.

Referring back to FIG. 11, in operation, DPD datapath portion 1102 receives input signal x[n] 712 and outputs a predistorted input signal w[n] 1106 to PA 704. Similar to ILA, DPD datapath portion 1102 in accordance with an aspect of the present invention is trained outside the forward path without the need for a PA model.

PA 704 outputs a signal 1108 to gain inverter 706. Gain inverter 706 outputs a signal z[n] 1110 to DPD adaptation portion 1104 as a feedback signal. As mentioned above, DPD datapath portion 1102, in accordance with an aspect of the present invention, additionally receives input signal x[n] 712. DPD adaptation portion 1104 outputs a signal $\hat{w}[n]$ 1112 to comparator 1106 and outputs an update signal 1114 to DPD datapath portion 1102. Comparator 708 compares signal $\hat{w}[n]$ 1112 with predistorted input signal w[n] 1106. Based on the comparison, comparator 708 then provides error signal e[n] 1116 back to DPD adaptation potion 1104.

Error signal e[n] 1116 is then fed back to DPD adaptation portion 1104, which will update the adjustment to predistorted input signal w[n] 1106 in order to linearize the gain of PA 704. More specifically, a trainable LUT portion within DPD adaptation portion 1104 (not shown) may update an LUT portion (not shown) within DPD datapath portion 1102 through a signal 1114 periodically, based on a predetermined time interval. As a consequence, predistorted input signal w[n] 1106 will be updated periodically in order keep an output signal 1108, from PA 704, linear. The HLA implementation in accordance with an aspect of the present invention will be explained mathematically as shown below.

If H(x) is the gain provided by the LUT (not shown) in DPD datapath portion 1102 for an input x, F(•) is the nonlinear gain of PA 704, $\tilde{H}$(•) is the gain provided by the LUT (not shown) in DPD datapath portion 1102 being trained, and G is the desired linear gain of PA 704, then the HLA in accordance with an aspect of the present invention adapts such that $$F(xH(x)) \cdot \tilde{H}(x) = G \quad (10)$$

In equation (10), F(xH(x)) represents the nonlinear gain of PA 704 and $\tilde{H}$(x) is used to compensate the nonlinearity of PA 704. Therefore, the compensation result G is the desired linear gain.

Using a more general system function representation with F(•) representing the operator of PA 704, H(•) representing the operator of DPD datapath portion 1102, and $\tilde{H}$(•) representing the operator of DPD datapath portion 1102 being trained, equation (10) can be written as $$\tilde{H}\left(x, \frac{F(H(x, x))}{G}\right) = H(x, x) \quad (11)$$

In equation (11), note that both $$\tilde{H}\left(x, \frac{F(H(x, x))}{G}\right)$$

and H(x,x) have two inputs. Equation (11) implies that outputs of DPD adaptation portion 1104 and DPD datapath portion 1102 are equal when the system is in stable state. In other words, PA 704 outputs a desired linear gain.

It is clear in Equation (10) that the HLA in accordance with an aspect of the present invention trains neither the pre-inverse, nor the post-inverse, of the nonlinearity of PA 704. However, simulations show that the use of the HLA in accordance with an aspect of the present invention for training DPD datapath portion 1102 leads to good linearization performance. When convergence is reached, equation (10) is identical to equation (1), showing that the converged solution is the pre-inverse of PA 704.

Figure 12A:
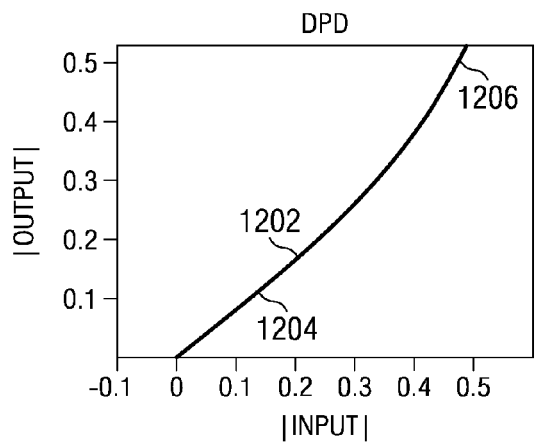
FIG. 12A is a graph of a gain transfer characteristics of the DPD datapath portion of the example HLA circuit of FIG. 11.
Figure 12B:
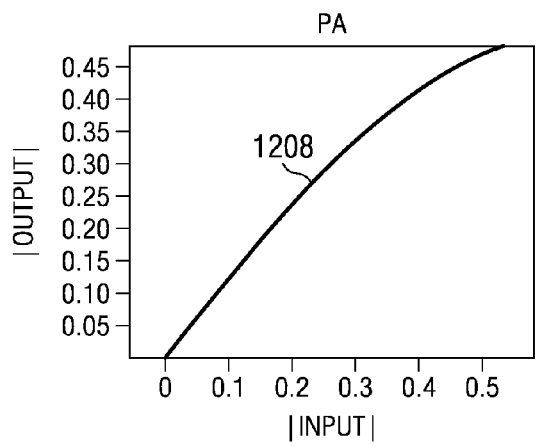
FIG. 12B is a graph of a gain transfer characteristics of the PA of the example HLA circuit of FIG. 11.
Figure 12C:
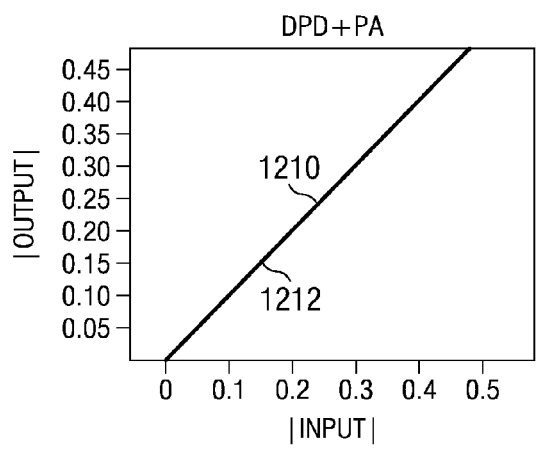
FIG. 12C is a graph of a gain transfer characteristics of the DPD datapath portion and the PA of the example HLA circuit of FIG. 11.

Although the HLA in accordance with an aspect of the present invention has identical computational and memory requirements as ILA, using HLA, the LUT (not shown) within DPD datapath portion 1102 is successfully trained in the upper entries as seen in FIGS. 12A-C.

Figure 8A:
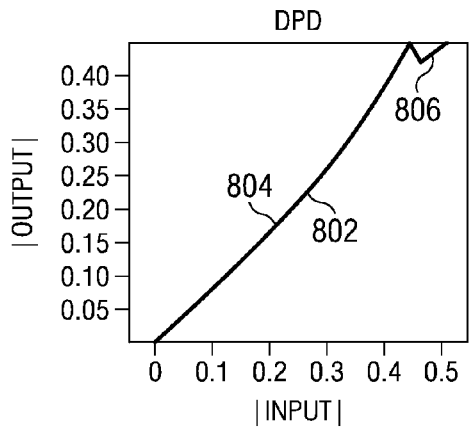
FIG. 8A is a graph of a gain transfer characteristics of the DPD datapath portion of FIG. 7.

FIG. 12A is a graph of a gain transfer characteristics of DPD datapath portion 1102, wherein the x-axis represents the input to DPD datapath portion 1102 and the y-axis represents the output from DPD datapath portion 1102. In FIG. 12A, a gain transfer characteristics 1202 is a curve having a first portion 1204 over the majority of the input portion of the graph that is curved slightly upward in a concave fashion and having a much smaller second portion 1206 at the very top upper input portion of the graph that is curved upward in a concave fashion. FIG. 12A shows that there is less distortion on the high input/output portion 1206, which differs from portion 806 in FIG. 8A. In other words, the higher amplitude entries in LUT are more difficult to be trained in the ILA as compared to the LUT in the HLA in accordance with an aspect of the present invention.

Figure 8B:
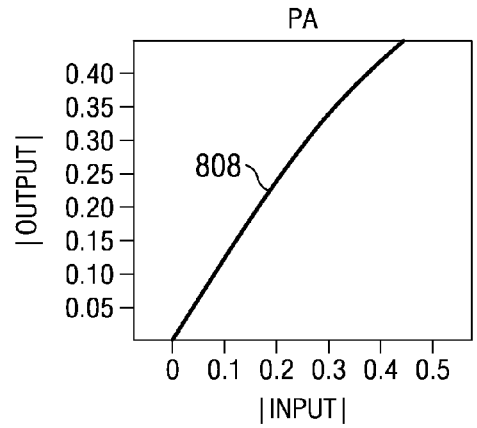
FIG. 8B is a graph of a gain transfer characteristics of the PA of FIG. 7.
Figure 8C:
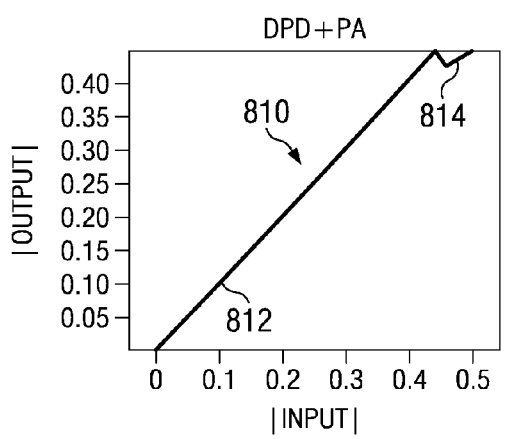
FIG. 8C is a graph of a gain transfer characteristics of the DPD datapath portion and the PA of FIG. 7.

FIG. 12B is a graph of a gain transfer characteristics of PA 704, wherein the x-axis represents the input to PA 704 and the y-axis represents the output from PA 404. Similar to FIG. 8B discussed above, in FIG. 12B, a gain transfer characteristics 1208 is a curve that is curved slightly downward in a convex fashion. The non-linearity of gain transfer characteristics 1208 illustrates the non-linearity of the power amplifier 704.

FIG. 12C is a graph of a gain transfer characteristics of DPD datapath portion 1102 and PA 704, wherein the x-axis represents the input to DPD datapath portion 1102 and the y-axis represents the output from PA 704. In FIG. 12C, a gain transfer characteristic 1210 is a curve having a first portion 1212 over the vast majority of the input portion of the graph that is linear. In other words, FIG. 12 illustrates that a gain inverse may be trained over a much larger input signal swing in the HLA in accordance with an aspect of the present invention.

The HLA provides improved performance over conventional learning architectures on linearizing a power amplifier's response, which results in reduced in-band error, reduced leakage in adjacent channels, and improved power amplifier efficiency.

Another aspect of the present invention is drawn to a method of separating error terms of contributing LUT entries. A Dual Adaptive Interpolated Lookup table (DAIL) in accordance with an aspect of the present invention improves upon standard gradient descent techniques for contributing LUT entries. An example embodiment of DAIL will now be described with reference to FIG. 13.

Figure 9:
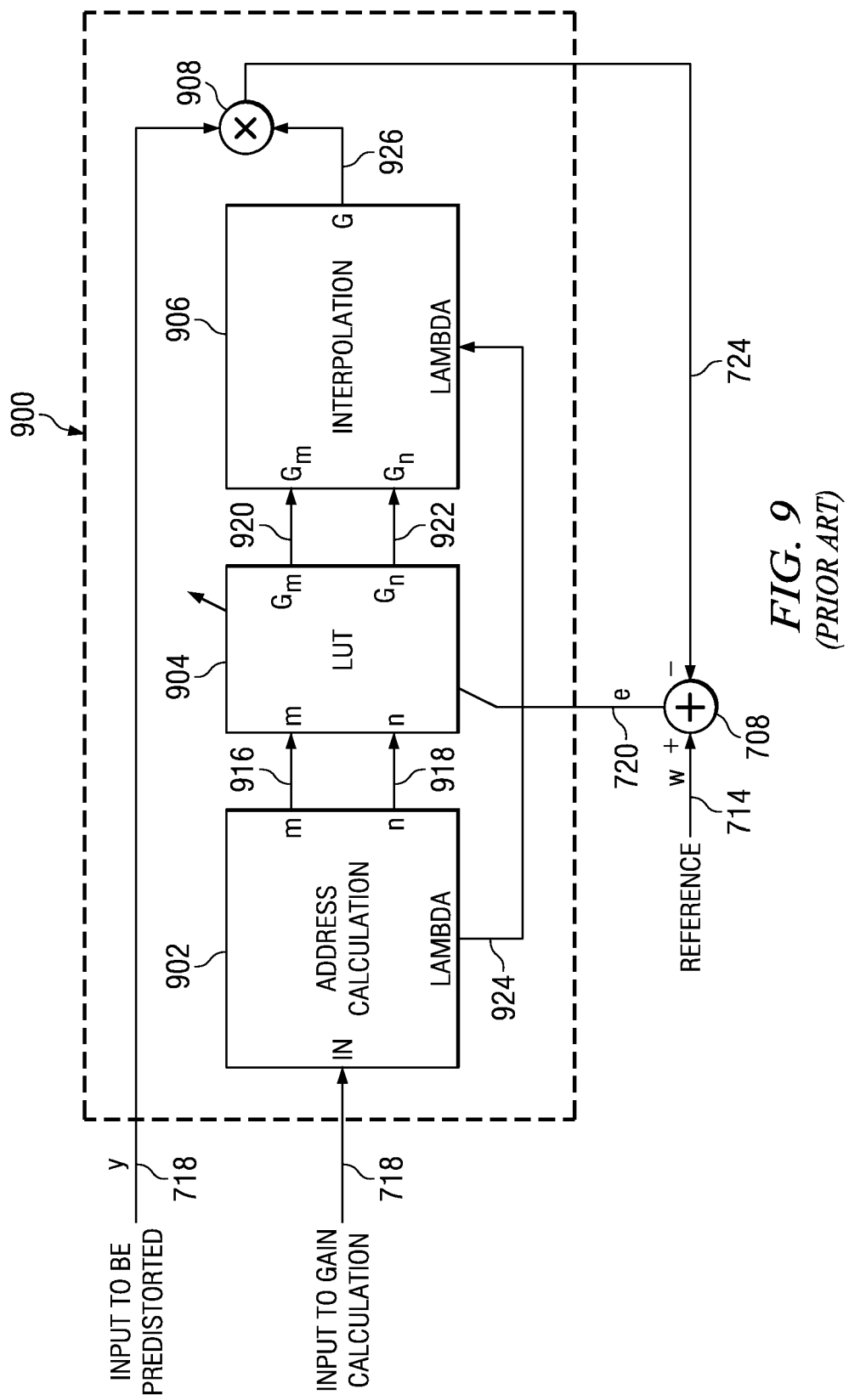
FIG. 9 illustrates an exploded view of the DPD adaptation portion of FIG. 7.
Figure 10:
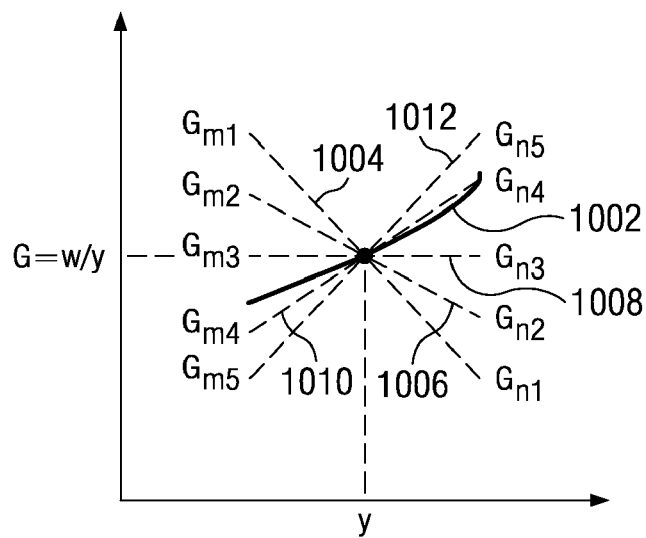
FIG. 10 is a graph of a plurality of interpolated gain functions.
Figure 13:
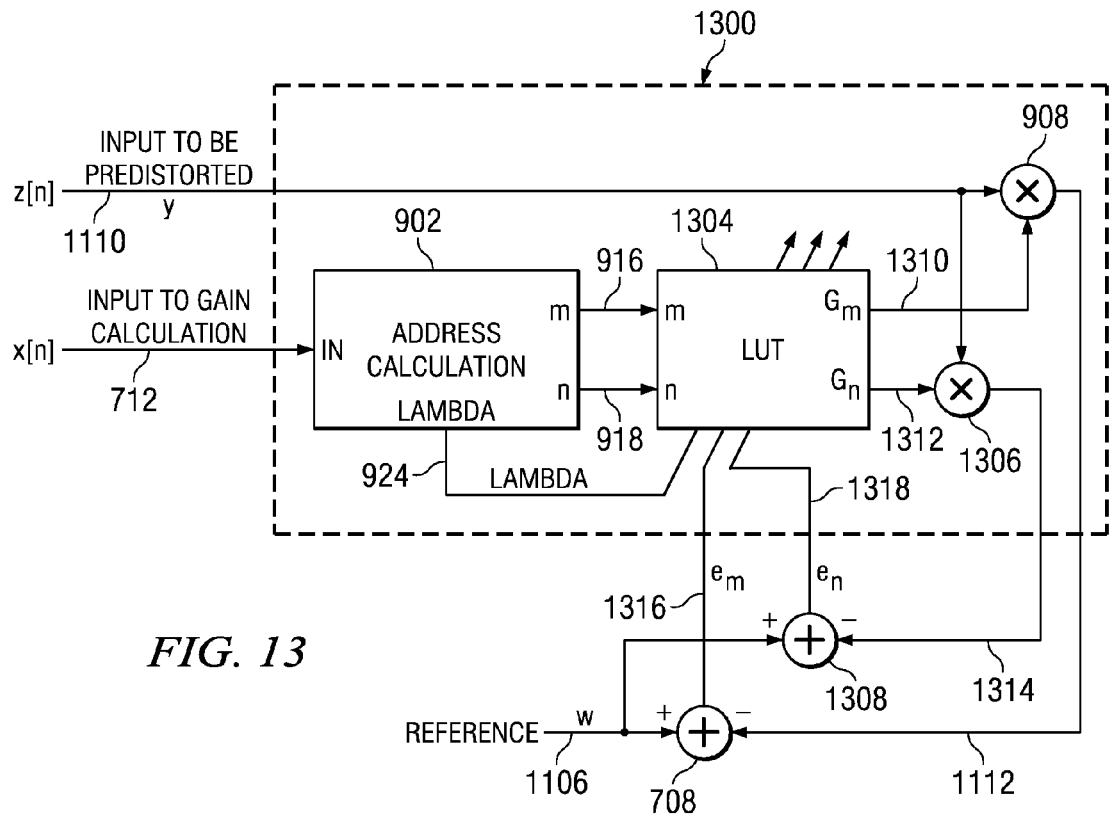
FIG. 13 illustrates an example Dual Adaptive Interpolated Lookup (DAIL) table in accordance with an aspect of the present invention.

Circuit 1300 of FIG. 13 differs somewhat from DPD adaptation portion 900 of FIG. 9. Circuit 1300 includes address calculator portion 902, a LUT portion 1304, multiplier 908, a multiplier 1306, comparator 708 and a comparator 1308.

In operation, address calculator portion 902 receives signal x[n] 712 and determines the appropriate indices m and n of LUT portion 1304. Address calculator portion 902 then outputs the indices information to LUT portion 1304 through indices signal 916 and 918. LUT portion 1304 provides the gains stored at the requested indices m and n.

The outputs of LUT portion 1304, $G_m$ and $G_n$, which are represented by signals 1310 and 1312, respectively, are based on interpolation factor $\lambda$ 924. Signal 1310 is provided to multiplier 908, whereas signal 1312 is provided to multiplier 1306. Multiplier 908 multiples gain $G_m$, which is provided by signal 1310, with input signal z[n] 1110 and outputs signal ŵ[n] 1112 to comparator 708. Multiplier 1306 multiples gain $G_n$, which is provided by signal 1312, with input signal z[n] 1110 and outputs a signal 1314 to comparator 1308.

Comparator 708 compares signal ŵ[n] 1112 with predistorted input signal w[n] 1106. Comparator 708 then sends a result of the comparison, error signal $e_m$ 1316, to LUT portion 1304. Comparator 1308 compares signal 1314 with predistorted input signal w[n] 1106. Comparator 1308 then sends a result of the comparison, error signal $e_n$ 1318, to LUT portion 1304.

Error signals $e_m$ 1316 and $e_n$ 1318 are used to modify indices within trainable LUT portion 1304, i.e., train trainable LUT portion 1304.

Figure 11:
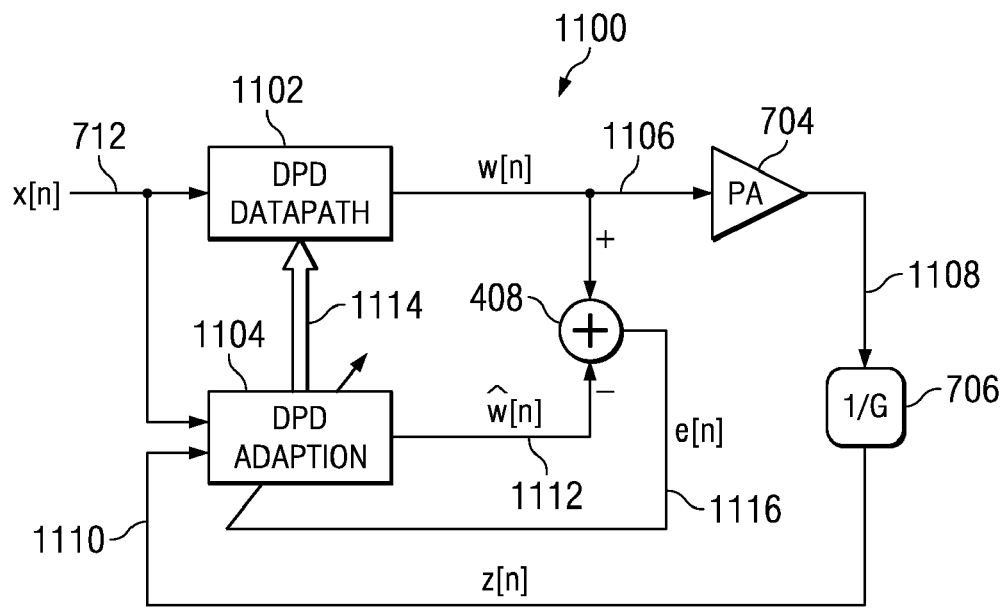
FIG. 11 illustrates an example HLA circuit in accordance with an aspect of the present invention.

With additional reference to FIG. 11, periodically, the indices within trainable LUT portion 1304 are copied to the LUT (not shown) within DPD datapath portion 1102. In an example embodiment, as error signals $e_m$ 1316 and $e_n$ 1318 become zero or approach zero, eventually the indices within trainable LUT portion 1304 are copied to the LUT within DPD datapath portion 1102. More specifically, as error signals $e_m$ 1316 and $e_n$ 1318 become zero or very close to zero and are used to train the LUT portion (not shown) within DPD datapath portion 1102, the outputted pair of the LUT portion within DPD datapath portion 1102, $G_m$ and $G_n$, will be used to provide a desired gain G to PA (not shown). The gain G may be based on either $G_m$ or $G_n$ in light of interpolation factor 924. Accordingly, predistorted input signal w[n] 1106 approaches a desired gain to PA 704.

A DAIL in accordance with an aspect of the present invention can also be mathematically explained as below.

Comparing a DAIL in accordance with an aspect of the present invention as illustrated in FIG. 13 with a conventional LMS as illustrated in FIG. 9, it is apparent that the DAIL in accordance with an aspect of the present invention eliminates the interpolation portion. Instead of using a common error sequence to drive the adaptation for both $G_m$ and $G_n$, in accordance with an aspect of the present invention, separate error terms are considered, leading to an error vector.

$$e = \begin{bmatrix} (1-\lambda)e_m \\ \lambda e_n \end{bmatrix} = \begin{bmatrix} (1-\lambda)(w - yG_m) \\ \lambda(w - yG_n) \end{bmatrix} \qquad (11)$$

The cost function C is defined as $$C = e^H e$$

$$C = (1-\lambda)^2 |e_m|^2 + \lambda^2 |e_n|^2 \qquad (12)$$

Therefore, for $\lambda \in (0,1)$, $$C = 0 \Rightarrow e = 0 \Rightarrow e_m = e_n = 0 \qquad (13)$$

Here $\lambda \in \{0,1\}$ is ignored since the probability of the indexing signal falling exactly at one of the indices of trainable LUT 1304 is close to zero. Since neighboring entries within trainable LUT 1304 are considered separately, only one unique pair of $\{G_m, G_n\}$ exists as a solution for a particular combination of $\{w, y\}$. This is shown in FIG. 14.

Figure 14:
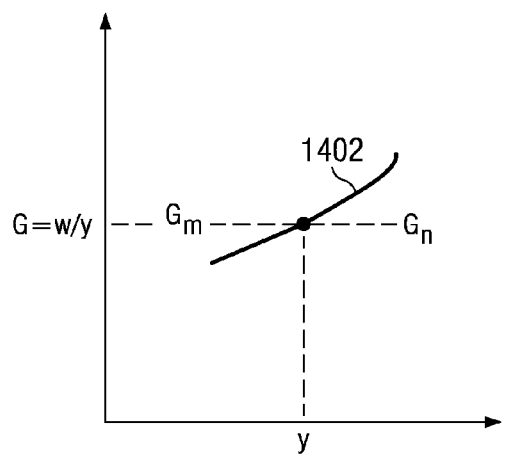
FIG. 14 is a graph of an interpolated gain function.

FIG. 14 is a graph of an interpolated gain function, wherein the x-axis is an input y and the y-axis is the associated gain G=w/y. In the figure, only one $\{G_m, G_n\}$ pair minimizes the cost function C. In FIG. 14, the solid line 1402 represents the correct gain to be applied for varying inputs y. This indicates that the entries for trainable LUT portion 1304 could vary within finite ranges. For example, if $G_n$ represents the true gain for index n, then $G_n$ can vary as $$G_{n-1} < G_n < G_{n+1} \quad (14)$$

The update equations are derived below $$\begin{bmatrix} G_m \\ G_n \end{bmatrix} = \begin{bmatrix} G_m \\ G_n \end{bmatrix} - \frac{\mu}{2} \nabla e^H e \quad (15)$$

$$\begin{bmatrix} G_m \\ G_n \end{bmatrix} = \begin{bmatrix} G_m \\ G_n \end{bmatrix} - \mu \begin{bmatrix} -(1-\lambda)y^* & 0 \\ 0 & -\lambda y^* \end{bmatrix} e$$

$$\begin{bmatrix} G_m \\ G_n \end{bmatrix} = \begin{bmatrix} G_m \\ G_n \end{bmatrix} + \mu y^* \begin{bmatrix} (1-\lambda)^2 e_m \\ \lambda^2 e_n \end{bmatrix}$$

It can be seen that contrary to equation (9), the update equations in equation (15) consider the relative correctness of each individual gain entry when determining the direction of the correction term. The scale factors affect the step size of the adaptation algorithm. Note that if $e_m$ and $e_n$ both point in similar directions, then the correction applied by the conventional LMS algorithm is larger than that applied by a DAIL in accordance with an aspect of the present invention, and vice versa.

A DAIL in accordance with an aspect of the present invention has some significant advantages over the standard gradient descent algorithms like LMS algorithm. First, DAIL does not require the computation of an interpolated gain. Second, for a given combination of {w, y}, only one {$G_m$, $G_n$} pair can minimize the cost function. Third, the direction of the correction applied to both {$G_m$, $G_n$} is determined by the correctness of each individual term. Finally, the additional computation can be executed in parallel although total computation might increase.

The tradeoffs of a DAIL in accordance with an aspect of the present invention are that there is a need to determine two separate error terms and there is a need for two separate adaptation algorithms.

A comparison has been made between the predistortion performance of a conventional LMS algorithm with a DAIL in accordance with an aspect of the present invention on a simulated PA. The simulation results with 16 iterations of adaptation are shown on FIGS. 15-17.

Figure 15:
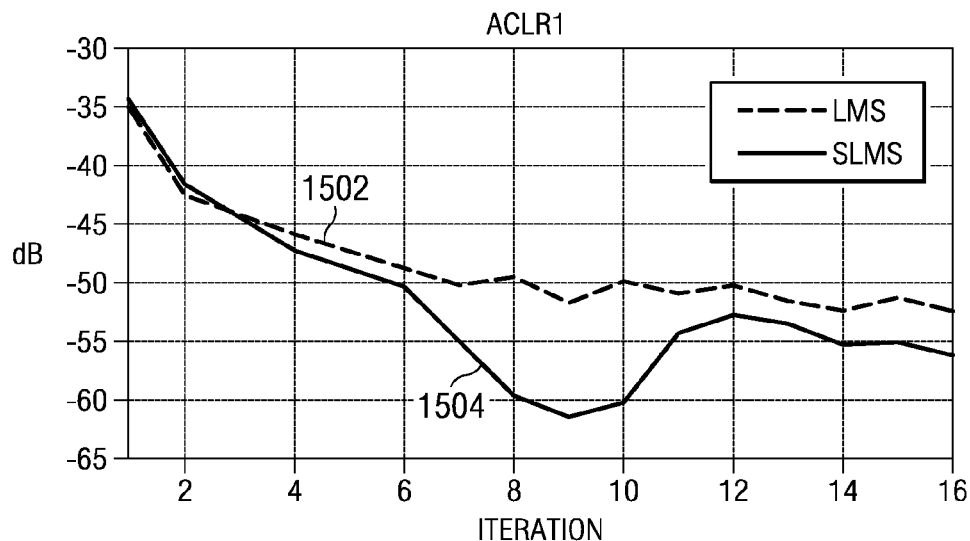
FIG. 15 is a graph that illustrates simulation results of an adjacent channel leakage ratio (ACLR) performance of a DAIL algorithm in accordance with an aspect of the present invention and a conventional LMS algorithm.
Figure 16:
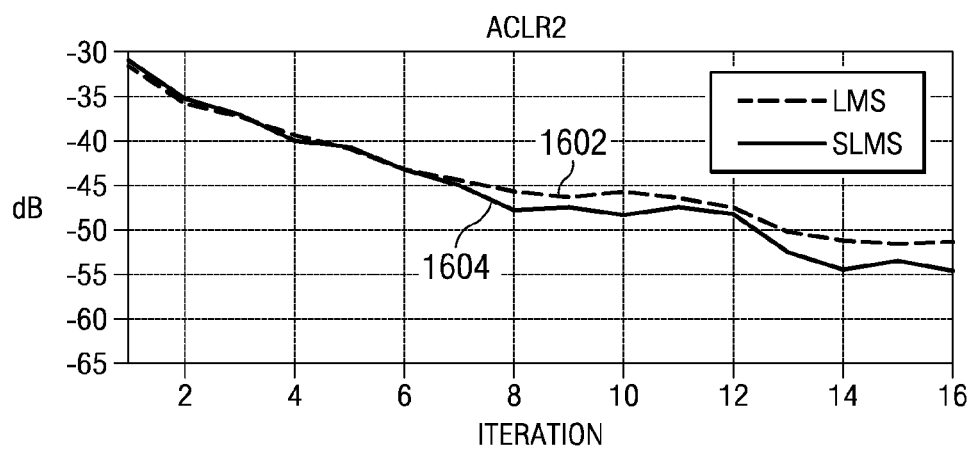
FIG. 16 is a graph that illustrates simulation results of the second adjacent channel leakage ratio performance of a DAIL algorithm in accordance with an aspect of the present invention and a conventional LMS algorithm.

FIG. 15 and FIG. 16 illustrate the simulation results of an Adjacent Channel Leakage Ratio (ACLR) with a DAIL algorithm in accordance with an aspect of the present invention and a conventional LMS algorithm. The ACLR is the ratio of the on channel transmit power to the power measured in one of the adjacent channels. A small ACLR is more desirable.

FIG. 15 is a graph that illustrates the adjacent channel ACLR performance, wherein the x-axis is the iteration of adaptation and the y-axis is the leakage ratio of the first adjacent channel. Dash-dotted line 1502 represents the simulation result of a conventional LMS algorithm and solid line 1504 represents the simulation of an example DAIL algorithm in accordance with the present invention. FIG. 15 shows line 1504 is well below line 1502. In other words, the example DAIL algorithm in accordance with the present invention has much lower ACLR than the conventional LMS algorithm.

FIG. 16 is a graph that illustrates the second adjacent channel ACLR performance, wherein the x-axis is the iteration of adaptation and the y-axis is the leakage ratio of the second adjacent channel. In the figure, dash-dotted line 1602 represents the simulation result of a conventional LMS algorithm and solid line 1604 represents the simulation of an example DAIL algorithm in accordance with the present invention. FIG. 16 additionally illustrates that DAIL algorithm still significantly outperforms standard LMS algorithm on second adjacent channel ACLR performance.

Figure 17:
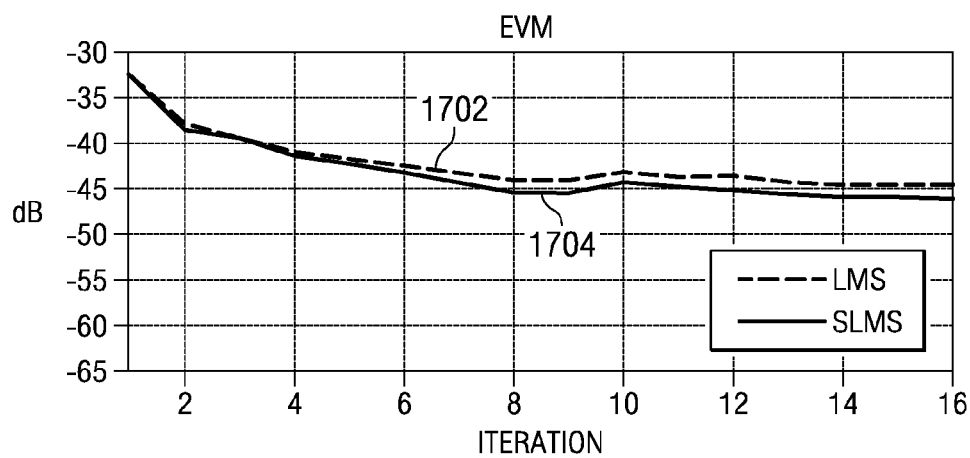
FIG. 17 illustrates the simulation results of an Error Vector Magnitude (EVM) performance of a DAIL algorithm in accordance with an aspect of the present invention and a conventional LMS algorithm.

FIG. 17 illustrates the simulation results of an Error Vector Magnitude (EVM) with an example DAIL algorithm in accordance with the present invention and a conventional LMS algorithm. EVM is the root mean square value of the error vector over time at die instant of symbol clock transitions. The smaller value of EVM means the better performance of modulation or demodulation accuracy. In FIG. 17, dash-dotted line 1702 represents the simulation result of a conventional LMS algorithm and solid line 1704 represents the simulation of an example DAIL algorithm in accordance with the present invention. FIG. 17 shows that line 1704 is below line 1702 all the time during simulation, which proves that the example DAIL algorithm in accordance with the present invention has a better EVM performance than the conventional LMS algorithm.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The exemplary embodiments, as described above, were chosen and described in order to best explain the principles of tie invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A circuit for use with an amplification circuit having:
 a predistortion datapath portion,
 a power amplifier portion, and
 a gain portion,
  the predistortion datapath portion being operable to output a predistorted signal based on an input signal,
  the power amplifier portion being operable to output an amplified signal based on the predistorted signal,
  the gain portion being operable to output a gain output signal based on the amplified signal,
 said circuit comprising:
 a digital predistortion adaptation portion operable to output a predistortion adaptation portion update signal to the predistortion datapath portion; and
 a combiner operable to output an error signal to the digital predistortion adaptation portion, wherein an input of the combiner is coupled to both an output of the digital predistortion datapath portion and an input of the power amplifier portion,
 wherein the digital predistortion adaptation portion receives three inputs:
  a) the input signal,
  b) the gain output signal, and
  c) the error signal, wherein the error signal is an output of the combiner, and
 the digital predistortion adaptation portion trains the predistortion datapath portion based on the three inputs.

2. The circuit of claim 1, wherein the error signal is based on the difference between the predistorted signal and a predistortion adaptation portion output signal.

3. The circuit of claim 2, wherein said digital predistortion adaptation portion comprises an address calculation portion, a look-up table portion, a first multiplier and a second multiplier, and said combiner further comprises a first adder and a second adder.

4. The circuit of claim 3, wherein said address calculation portion is operable, based on the input signal, to output a first address index signal, a second address index signal and an interpolation factor signal.

5. The circuit of claim 4,
wherein said first multiplier is operable to output a first multiplier signal,
wherein said second multiplier is operable to output a second multiplier signal,
wherein said first adder is operable to output a first index error signal, and
wherein said second adder is operable to output a second index error signal.

6. The circuit of claim 1, wherein said digital predistortion adaptation portion comprises an address calculation portion, a look-up table portion, a first adder, a second adder, a first multiplier and a second multiplier.

7. The circuit of claim 6, wherein said address calculation portion is operable, based on the input signal, to output a first address index signal, a second address index signal and an interpolation factor signal.

8. The circuit of claim 7,
wherein said first multiplier is operable to output a first multiplier signal,
wherein said second multiplier is operable to output a second multiplier signal,
wherein said first adder is operable to output a first index error signal, and
wherein said second adder is operable to output a second index error signal.

9. The circuit of claim 1, wherein a LUT training occurs without a need for a power amplifier model.

10. The circuit of claim 1, wherein the input signal is employed to select at least one gain entry of a look-up table.

11. A circuit for use with an amplification circuit having a predistortion datapath portion, a power amplifier portion and a gain portion, the predistortion datapath portion being operable to output a predistorted signal based on an input signal, the power amplifier portion being operable to output an amplified signal based on the predistorted signal, the gain portion being operable to output a gain output signal based on the amplified signal, said circuit comprising:
a digital predistortion adaptation portion operable to output a predistortion adaptation portion update signal to the predistortion datapath portion; and
a combiner operable to output an error signal,
wherein the predistortion adaptation portion update signal is based on the input signal, the gain output signal, and the error signal,
wherein the error signal is based on the difference between the predistorted signal and a predistortion adaptation portion output signal,
wherein said digital predistortion adaptation portion comprises an address calculation portion, a look-up table portion, a first multiplier and a second multiplier, and said combiner further comprises a first adder and a second adder,
wherein said address calculation portion is operable, based on the input signal, to output a first address index signal, a second address index signal and an interpolation factor signal,
wherein said first multiplier is operable to output a first multiplier signal,
wherein said second multiplier is operable to output a second multiplier signal,
wherein said first adder is operable to output a first index error signal,
wherein said second adder is operable to output a second index error signal,
wherein said look-up table portion is operable to output a first gain index signal and a second gain index signal,
wherein the first multiplier signal is based on the first gain index signal and the gain output signal,
wherein the second multiplier signal is based on the second gain index signal and the gain output signal,
wherein the first index error signal is based on the predistorted signal and the first multiplier signal, and
wherein the second index error signal is based on the predistorted signal and the second multiplier signal.

12. A circuit for use with an amplification circuit having a predistortion datapath portion, a power amplifier portion and a gain portion, the predistortion datapath portion being operable to output a predistorted signal based on an input signal, the power amplifier portion being operable to output an amplified signal based on the predistorted signal, the gain portion being operable to output a gain output signal based on the amplified signal, said circuit comprising:
a digital predistortion adaptation portion operable to output a predistortion adaptation portion output signal; and
a combiner operable to output an error signal,
wherein the predistortion adaptation portion output signal is based on the input signal, the gain output signal and the error signal,
wherein said digital predistortion adaptation portion comprises an address calculation portion, a look-up table portion, a first multiplier and a second multiplier, said combiner further comprises a first adder and a second adder,
wherein said address calculation portion is operable, based on the input signal, to output a first address index signal, a second address index signal and an interpolation factor signal,
wherein said first multiplier is operable to output a first multiplier signal,
wherein said second multiplier is operable to output a second multiplier signal,
wherein said first adder is operable to output a first index error signal, and
wherein said second adder is operable to output a second index error signal,
wherein said a look-up table portion is operable to output a first gain index signal and a second gain index signal,
wherein the first multiplier signal is based on the first gain index signal and the gain output signal,
wherein the second multiplier signal is based on the second gain index signal and the gain output signal,
wherein the first index error signal is based on the predistorted signal and the first multiplier signal, and
wherein the second index error signal is based on the predistorted signal and the second multiplier signal.

13. A circuit operable to receive an input signal, said circuit comprising:
a predistortion datapath portion operable to output a predistorted signal based on the input signal;
a power amplifier portion operable to output an amplified signal based on the predistorted signal;
a gain portion operable to output a gain output signal based on the amplified signal;

a digital predistortion adaptation portion operable to output a predistortion adaptation portion update signal to the predistortion datapath portion; and a combiner operable to output an error signal to the digital predistortion adaptation portion, wherein an input of the combiner is coupled to both an output of the digital predistortion datapath portion and an input of the power amplifier portion, wherein the digital predistortion adaptation portion receives three inputs:
a) the input signal,
b) the gain output signal and
c) the error signal, wherein the error signal is an output of the combiner, and the digital predistortion adaptation portion trains the predistortion datapath portion based on the three inputs.

14. The circuit of claim 13, wherein the error signal is based on the difference between the predistorted signal and a predistortion adaptation portion output signal.

15. The circuit of claim 14, wherein said digital predistortion adaptation portion comprises an address calculation portion, a look-up table portion, a first multiplier and a second multiplier, and said combiner further comprises a first adder and a second adder.

16. The circuit of claim 15, wherein said address calculation portion is operable, based on the input to output a first address index signal, a second address index signal and an interpolation factor signal.

17. The circuit of claim 16,
wherein said first multiplier is operable to output a first multiplier signal,
wherein said second multiplier is operable to output a second multiplier signal,
wherein said first adder is operable to output a first index error signal, and
wherein said second adder is operable to output a second index error signal.

18. The circuit of claim 13, wherein said digital predistortion adaptation portion comprises an address calculation portion, a look-up table portion, a first adder, a second adder, a first multiplier and a second multiplier.

19. The circuit of claim 18, wherein said address calculation portion is operable, based on the input signal, to output a first address index signal, a second address index signal and an interpolation factor signal.

20. The circuit of claim 19,
wherein said first multiplier is operable to output a first multiplier signal,
wherein said second multiplier is operable to output a second multiplier signal,
wherein said first adder is operable to output a first index error signal, and
wherein said second adder is operable to output a second index error signal.

21. The circuit of claim 20,
wherein said a look-up table portion is operable to output a first gain index signal and a second gain index signal,
wherein the first multiplier signal is based on the first gain index signal and the gain output signal,
wherein the second multiplier signal is based on the second gain index signal and the gain output signal,
wherein the first index error signal is based on the predistorted signal and the first multiplier signal, and
wherein the second index error signal is based on the predistorted signal and the second multiplier signal.

22. The circuit of claim 13, wherein a LUT training occurs without a need for a power amplifier model.

23. The circuit of claim 13, wherein the input signal is employed to select at least one gain entry of a look-up table.

24. A circuit operable to receive an input signal, said circuit comprising:
predistortion datapath portion operable to output a predistorted signal based on the input signal;
a power amplifier portion operable to output an amplified signal based on the predistorted signal;
a gain portion operable to output a gain output signal based on the amplified signal;
a digital predistortion adaptation portion operable to output a predistortion adaptation portion output signal; and
a combiner operable to output an error signal,
wherein the predistortion adaptation portion output signal is based on the input signal, the gain output signal, and the error signal,
wherein the error signal is based on the difference between the predistorted signal and the predistortion adaptation portion output signal,
wherein said digital predistortion adaptation portion comprises an address calculation portion, a look-up table portion, a first multiplier and a second multiplier, and said combiner further comprises a first adder and a second adder,
wherein said address calculation portion is operable, based on the input signal, to output a first address index signal, a second address index signal and an interpolation factor signal,
wherein said first multiplier is operable to output a first multiplier signal,
wherein said second multiplier is operable to output a second multiplier signal,
wherein said first adder is operable to output a first index error signal, and
wherein said second adder is operable to output a second index error signal,
wherein said look-up table portion is operable to output a first gain index signal and a second gain index signal,
wherein the first multiplier signal is based on the first gain index signal and the gain output signal,
wherein the second multiplier signal is based on the second gain index signal and the gain output signal,
wherein the first index error signal is based on the predistorted signal and the first multiplier signal, and
wherein the second index error signal is based on the predistorted signal and the second multiplier signal.

* * * * *